United States Patent [19]

Thomas

[11] 3,959,889
[45] June 1, 1976

[54] METHOD AND APPARATUS FOR DETERMINING A MEASURED DIRECTION RELATIVE TO AN EXTERNAL MAGNETIC DIRECTION

[76] Inventor: Samuel M. Thomas, 12 Beech Hill Road, Lloyd Harbor, N.Y. 11743

[22] Filed: Nov. 29, 1974

[21] Appl. No.: 528,428

[52] U.S. Cl. .............................. 33/361; 33/355 R; 33/363 R; 324/47
[51] Int. Cl.² .................. G01C 17/30; G01R 33/02
[58] Field of Search ............ 33/362, 363, 361, 356, 33/355; 324/43 R, 47, 45

[56] References Cited
UNITED STATES PATENTS

| | | | |
|---|---|---|---|
| 2,036,444 | 4/1936 | Tolson | 33/362 |
| 2,132,183 | 10/1938 | Oakley | 33/362 |
| 2,837,829 | 6/1958 | Fayers et al. | 33/361 |
| 3,634,946 | 1/1972 | Star | 33/356 |
| 3,825,823 | 7/1974 | Rovner | 33/363 R |

Primary Examiner—William D. Martin, Jr.
Attorney, Agent, or Firm—St. Onge Mayers Steward & Reens

[57] ABSTRACT

An apparatus is disclosed for determining a measured direction such as the direction of a ship or airplane relative to an external magnetic field such as the magnetic field of the earth. This apparatus comprises means for establishing a magnetic field rotating at constant angular velocity, located to influence the external magnetic field. The rotating magnetic field vector bears a known angular relationship as a function of time to the measured direction. A detector is located to be influenced by the rotating and external fields for detecting the occurrence of a predetermined angular relationship between the rotating and external magnetic field vectors. A timing device measures the time between occurrence of the predetermined angular relationship between the rotating and external field vectors and occurrence of the same predetermined angular relationship between the rotating field vector and the measured direction, and comparator means compares the measured time with the period of rotation of the rotating magnetic field. The resulting ratio of measured time to period is directly proportional to and thus indicates the angle which the measured direction makes relative to the external magnetic field. The apparatus may be provided with a display for indicating this angle or an error function for indicating deviation from a preselected angle.

Methods for indicating the measured direction relative to the external magnetic field and for indicating measured direction deviation from a preselected angle made with respect to the external field are also disclosed.

19 Claims, 5 Drawing Figures

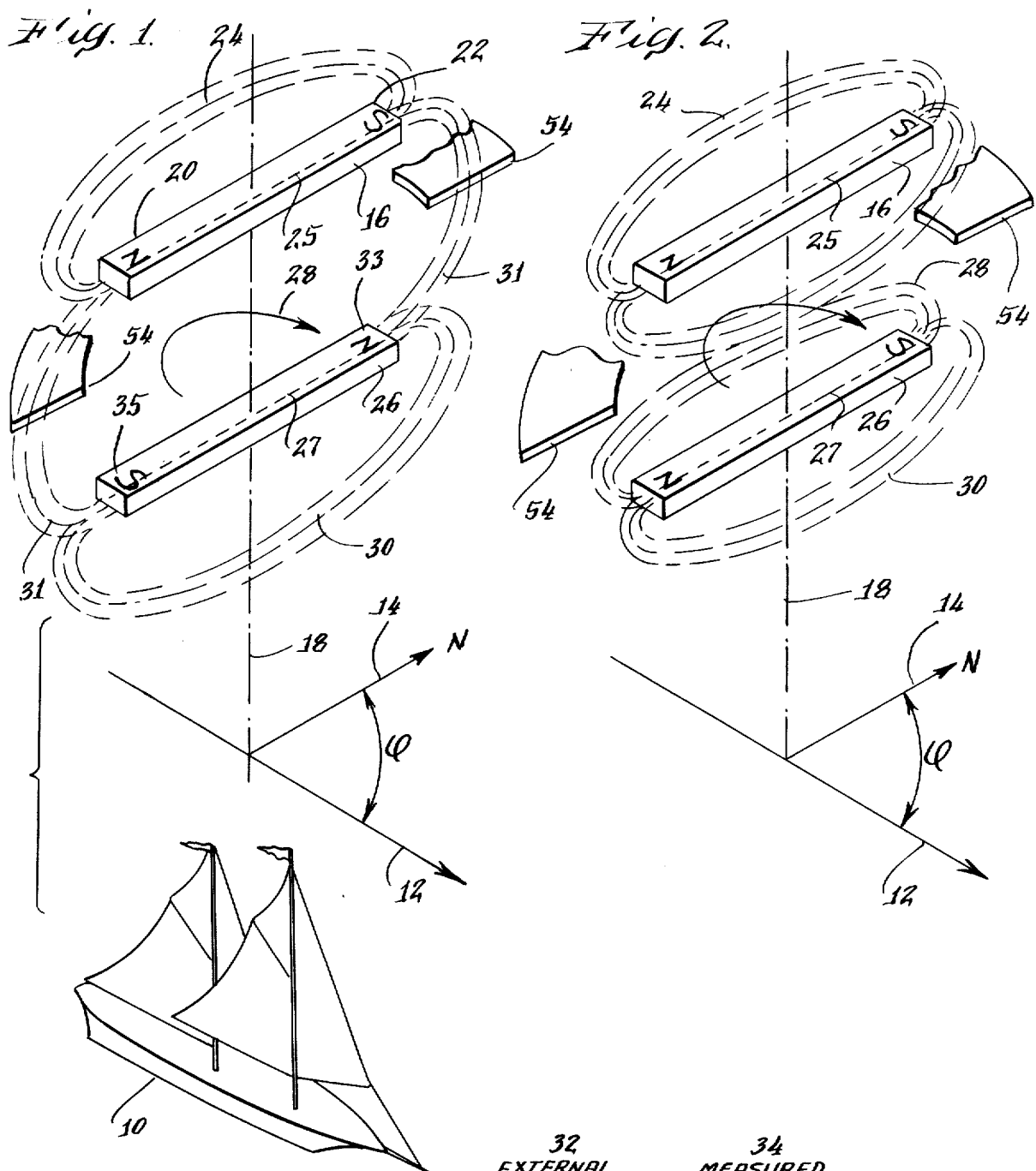
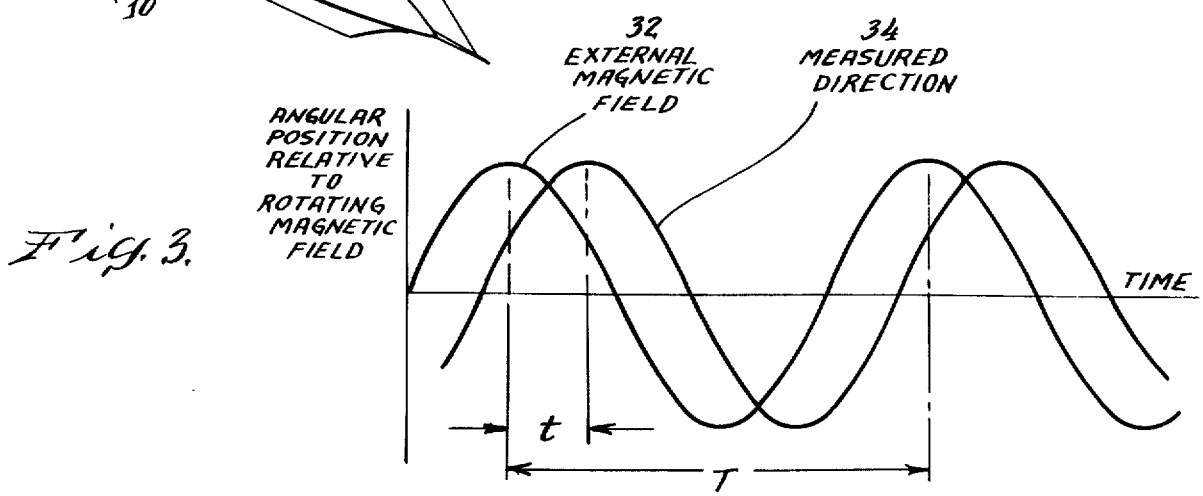

METHOD AND APPARATUS FOR DETERMINING A MEASURED DIRECTION RELATIVE TO AN EXTERNAL MAGNETIC DIRECTION

BACKGROUND OF THE INVENTION

1. Field of the Invention

The present invention relates to a method and apparatus for determining a measured direction relative to an external magnetic field and for indicating this measured direction in digital or analog form for display or utilization in operating an error function.

The external magnetic field of most common interest, which forms the basis of much terrestrial navigation for ships, airplanes, automobiles, or other means of transportation, is the earth's magnetic field. Since this field is relatively constant, it is a convenient reference against which other variable directions are measured.

It may also be of interest to determine a measured direction relative to some external magnetic field other than the earth's or to detect changes in the relative external magnetic field caused by external ferromagnetic objects or apparatus motion. The method and apparatus of the present invention can be used in any such application.

2. Description of the Prior Art

Devices which determine a measured direction relative to the earth's magnetic field are usually called compasses. Though various forms of mechanical compasses have been known for centuries and improvements to them have continuously been made, the basic principle of their operation remains unchanged. In particular, mechanical compasses generally include some form of an elongate magnetic bar rotatably mounted so that it can align itself with the earth's field. A compass card or scale is mounted relative to the bar which an operator can then read to determine the measured direction.

Mechanical compasses are usually suspended in a gimbal to maintain their level attitude when their support is tipped, and dampened to lessen the effect of external vibrations which they might experience. However, certain gimbals are complex, awkward, and expensive. Mechanical dampening methods and devices are not well suited for use in compasses employed in some applications.

Electronic compasses have been developed to overcome certain difficulties associated with mechanical compasses. For example, U.S. Pat. No. 3,825,823 — Rovner discloses an apparatus for detecting a magnetic field relative to a marker direction, that operates without moving parts, incorporating a flux gate magnetometer having a plurality of sensing coil arrays each aligned with a given direction. The flux gate is driven by an R. F. generator. A scanner sequentially connects each array to a detector to determine which sensing coil system of two coil arrays is perpendicular to the external field. The resolving power or ability of this apparatus to distinguish between small angular differences in direction is determined by the number of sensing coil arrays which are coupled to the flux gate, and is, in practicality, limited by the number the flux gate can physically accommodate. Furthermore, the electronic circuitry for scanning each sensing coil system is relatively complex and its complexity increases when large numbers of sensing coils are employed to improve the angular resolution.

U.S. Pat. No. 2,922,227 — Turner et al. discloses a similar device which includes a flux gate comprising a ring core, a toroidal coil wound about the ring, and a pair of sensing coils coupled at diametrically opposed positions to the ring. The ring is rotationally driven in response to the magnetic field sensed by the flux gate to maintain a particular attitude with respect to the external field. The position of the ring is then used to indicate the position of the external field.

U.S. Pat. No. 2,924,886 — Cullen discloses a transmitting magnetic compass that includes a semiconductor sensing element that is arranged to rotate to align itself in a particular attitude with the external field. The angular position of the semiconductor is transmitted to a receiver to be read by an operator as the direction of the external field.

Both the Cullen and Turner et al. patents disclose means for tracking the external field which are then sensed to determine the external field's direction. In addition, both apparatus disclosed employ moving parts and, therefore, are characterized by certain disadvantages of conventional mechanical compasses.

Other devices which employ flux gate magnetometers are disclosed in U.S. Pat. Nos. 2,426,470 — Sinks and 2,342,637 — Bechberger. Other compass constructions are disclosed in U.S. Pat. Nos. 3,833,901 — Fowler; 2,886,989 — Karlson; 2,755,562 — Hurlburt; 2,611,191 — Noxon et al.; 2,502,786 — Hayslett; and 2,454,184 — Kliever. These latter patents have been reviewed and are considered more remote from the present invention then the disclosures reviewed in detail. They are cited in order to be complete and in case the reader deems them of interest.

SUMMARY OF THE INVENTION

In a preferred embodiment to be described below in detail, the apparatus of the present invention for determining a measured direction which may be the heading or orientation of a ship, airplane, automobile or the like, relative to an external magnetic field comprises means for establishing a magnetic field which rotates at a known, constant angular velocity within influencing range of the external magnetic field. The rotating magnetic field vector bears a known angular relationship to the measured direction as a function of time. For each revolution, the rotating magnetic field vector lies within the same plane and points in the opposite direction to the direction measured. That is, they are oppositely directed and axially aligned. Similarly, for each revolution, the rotating and external fields are oppositely directed with their respective field vectors or axes lying in the same plane. That is, the respective field vectors are oppositely directed and axially aligned.

Note that for purposes of this specification and the concluding claims, the terms "axially aligned" and "axial alignment" denote the situation where the external and rotating magnetic field vectors or axes lie in a common plane. These terms also denote the situation where the rotating magnetic field vector and the measured direction lie in a common plane.

When oppositely directed axial rotating and external magnetic field alignment occurs, the magnetic field strength between adjacent poles of the respective rotating and external fields is maximum.

Detector means are provided to be influenced by the rotating and external magnetic fields for detecting occurrence of oppositely directed axial alignment of the rotating and external magnetic field vectors. This detection is achieved by sensing occurrence of maximum magnetic field strength between the rotating and external fields when they are axially aligned. Timing means are provided to measure the time between occurrence of oppositely directed, axial alignment of the rotating and external field vectors and occurrence of oppositely directed axial alignment of the rotating field vector and the measured direction. Comparator means are included to yield a ratio of the time between these occurrences to the period of rotation of the rotating magnetic field.

Since the rotating field rotates at a constant known angular velocity and has constant period which is also known, the time between occurrences is directly proportional to the angle which the measured direction makes relative to the direction of the external magnetic field. For a given scale, such as degrees, the angle between the respective measured direction and external magnetic field is given by the time between occurrences multiplied by a scale factor ($n$), divided by the period of rotation of the rotating magnetic field, where ($n$) is the total number of units of the scale in the circumference of a circle. The scale factor ($n$) is ordinarily 360.

Accordingly, the present invention includes means for computing the ratio, yielded by the comparator, of the time between the occurrences to the period of rotation of the rotating magnetic field multiplied by the scale factor ($n$). Means for providing a digital or analog display of the result or for utilizing the result to calculate deviation of the actual heading from a preselected heading may be incorporated.

In a preferred embodiment, the means for establishing a rotating magnetic field within the external magnetic field include a north-south coil having at least one winding and an east-west coil also having at least one winding disposed in mutually perpendicular relation to the north-south coil winding. A quadrature oscillator is coupled to the respective windings to provide the north-south coil with a first driving alternating electric signal and the east-west coil with a second driving alternating electric signal ninety degrees out of phase with respect to the first driving signal. A fix on the measured direction is provided by arranging the winding of one of the east-west or north-south coils to be perpendicular to that direction. Indication of axial alignment of the rotating magnetic field with the measured direction is provided by monitoring the driving signal supplied to the one coil to determine when its amplitude is maximum. Furthermore, this driving signal constitutes a quadrature oscillator output signal which indicates the relative angular position of the rotating field and the measured direction at any given time.

The means for detecting oppositely directed axial alignment of the rotating and external magnetic fields comprises a high frequency oscillator which generates an alternating electric output signal of high frequency relative to the frequency of the rotating magnetic field. A magnetic field sensor which includes a ring-shaped core and a toroidal coil wound about the core, mounted to be influenced by the rotating and external magnetic fields, is coupled to the high frequency oscillator to frequency modulate its output signal in response to the magnitude of total magnetic flux through the field sensor. When the frequency of the modulated output signal is maximum, oppositely directed, axial alignment of the rotating and external fields is indicated. Moreover, demodulation of high frequency oscillator output signal gives a direct indication of the relative angular position of the rotating and external magnetic fields at any given time.

The difference in phase between the respective quadrature oscillator and demodulated high frequency oscillator output signals yields a direct measure of the time between the occurrences of interest. Other electronic means for determining this phase difference and for computing the ratio of the time between the occurrences to the period of rotation of the rotating magnetic field multiplied by the scale factor are described below in detail.

The preferred embodiment of the method of the present invention is also described below in detail.

The method and apparatus of the present invention provide a simple and accurate method of determining a measured direction relative to the direction of an external magnetic field.

The apparatus has capability for very high resolving power. It also provides a rapid response time since mechanical damping of moving components is reduced. In addition, though desirably mounted in a gimbal, the apparatus gives either instantaneous or time averaged heading readings and, hence perturbations resulting from small angular displayment from level attitude are easily removed electronically.

Accordingly, it is an object of the present invention to provide a method and apparatus for determining a measured direction relative to an external magnetic field for use in a digital or analog display or in an error function.

Other objects, aspects and advantages of the present invention will be pointed out in or will be understood from a consideration of the detailed description provided below in conjunction with the accompanying drawings.

BRIEF DESCRIPTION OF THE DRAWINGS

FIG. 1 is a diagrammatic view of a portion of the apparatus of the present invention useful in illustrating the principles of its operation. A rotating magnetic field is shown in axial alignment but directed oppositely to a compass bar indicative of the earth's magnetic field.

FIG. 2 is a second diagrammatic view of the portion of the apparatus of the present invention shown in FIG. 1. The rotating magnetic field is in axial alignment with and identically directed to the compass bar.

FIG. 3 is a graph of the relative angular position of the rotating and external magnetic fields as a function of time superimposed on a graph of the relative angular position of the rotating magnetic field and the measured direction as a function of time.

DESCRIPTION OF THE PREFERRED EMBODIMENTS

Figure 4:
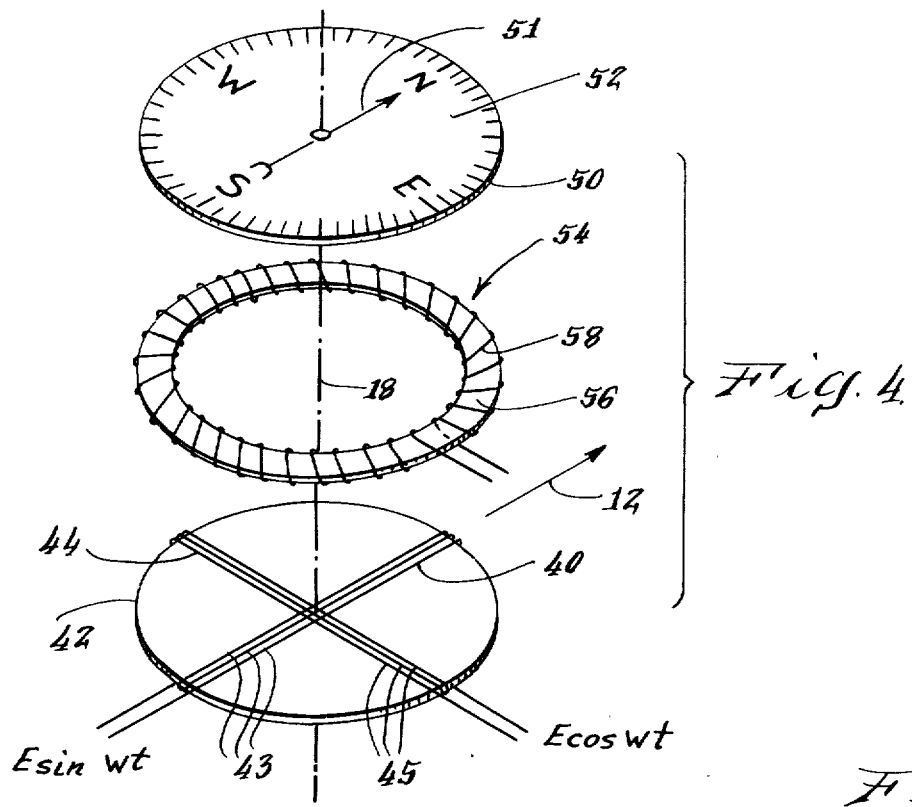
FIG. 4 is an enlarged view of the mutually perpendicular north-south and east-west coils for producing a rotating magnetic field and the magnetic field sensor for detecting oppositely directed axial alignment of the rotating and external magnetic field vectors.

The principle of operation of the method and apparatus of the present invention is best illustrated with reference to FIGS. 1, 2 and 3.

It is often desirable to determine a measured direction, for example, the direction indicated by arrow 12 of the axis of a vehicle such as a ship 10 relative to the direction of the earth's magnetic field, indicated by arrow 14. The direction of the earth's magnetic field may be ascertained by a conventional compass, in particular, a magnetic compass bar 16, mounted to rotate about a pivot 18, having respective north and south poles 20 and 22 that are attracted to opposite magnetic poles of the earth. The physical axis 25 of the compass bar 16 is coincident with its magnetic field vector or the axis of its magnetic field generally indicated by field lines 24. The direction of the axis of this compass bar magnetic field and, hence, the direction of the axis of the earth's magnetic field, forms an angle $\phi$ with the ship's heading 12. This angle $\phi$ is the quantity of interest.

The method and apparatus of the present invention directly determine the angle $\phi$ and include means for establishing a rotating magnetic field within the external magnetic field. In FIGS. 1 and 2, this means is illustrated as a second bar magnet 26 mounted for rotation, indicated by arrow 28, about the pivot axis 18 of the compass bar 16 at known, constant angular velocity. This bar magnet also has north and south poles 33 and 35 respectively. The physical axis 27 of the rotating bar magnet 26 is similarly coincident with its magnetic field vector or the axis of its magnetic field, generally indicated by field lines 30.

As shown in FIG. 1, when opposite poles of the respective compass bar 16 and bar magnet 26 are oppositely directed and axially aligned, that is, when the magnetic fields of the compass bar 16 and bar magnet 26 are oppositely directed and their respective axes lie in the same plane, magnetic field strength between them is maximum. Thus, magnetic field lines 31 emanate from the north pole of one magnet and terminate at the south pole of the opposite magnet. The respective compass bar 16 and bar magnet 26 are aligned in this manner to produce maximum magnetic field strength between them once for each revolution of the rotating magnet.

FIG. 2 illustrates the situation where the compass bar 16 and the bar magnet 26 are axially aligned but identically directed, that is, where like poles of the compass bar 16 and the bar magnet 26 are aligned and opposite each other, with respective axes in the same plane. When this configuration results, the magnetic field strength between the respective magnetis is minimum. Such minimum magnetic field strength also occurs once for each revolution of the rotating magnetic field.

A magnetic field sensor 54 is disposed to sense the changing magnetic field between the compass bar and the bar magnet. Thus, as shown in FIGS. 1 and 2 respectively, when field strength is maximum, many field lines 31 pass through the sensor but when field strength is minimum, few or none do.

When plotted as a function of time, the relative angular position of the normally stationary compass bar and the uniformly rotating bar magnet indicated by the magnetic field strength between them, is a sinusoidal curve such as that indicated at 32 in FIG. 3. When plotted as a function of time, the relative angular position of the rotating bar magnet with respect to the measured direction 12 is also a sinusoidal curve, indicated at 34 in FIG. 3.

Both curves 32 and 34 have the same period and frequency determined by the period and frequency of rotation of the bar magnet. If the external field and the measured direction are not coincident, the curve 34 will be shifted with respect to the curve 32 or the respective curves 32 and 34 will be out of phase. The phase shift between the curves is indicative of the time between occurrence of oppositely directed, axial alignment of the rotating bar magnet with the compass bar and occurrence of oppositely directed axial alignment of the rotating bar magnet with the measured direction.

Accordingly, if:

$\omega$ = the angular velocity of the rotating magnetic field; and

T = the period of rotation of the rotating magnetic field.

Further, if:

$\phi$ = the angle between the external magnetic field and the measured direction, and $t$ = the time between occurrence of oppositely directed, axial alignment of the rotating and external magnetic fields and occurrence of oppositely directed, axial alignment of the rotating magnet field and the measured direction, reflected by the phase difference between curves 32 and 34.

Then $$\phi = \omega t \qquad (1)$$

Therefore:

$$\phi = \frac{360° \, t}{T} = \frac{nt}{T} \qquad (2)$$

Since $\phi$ is directly proportional to $t$, $\phi$ can be determined by measuring the time between the respective occurrences.

Note that since the frequency and period of the curves 32 and 34 are identical, the time between occurrences of any given angular position of the external magnetic field and measured direction relative to the rotating magnetic field, other than oppositely directed axial alignment, may be measured. For example, the positive going zero crossings of the respective curves, which indicate that the external magnetic field or measured direction are perpendicular to the rotating field, are also separated by time $t$.

Figure 5:
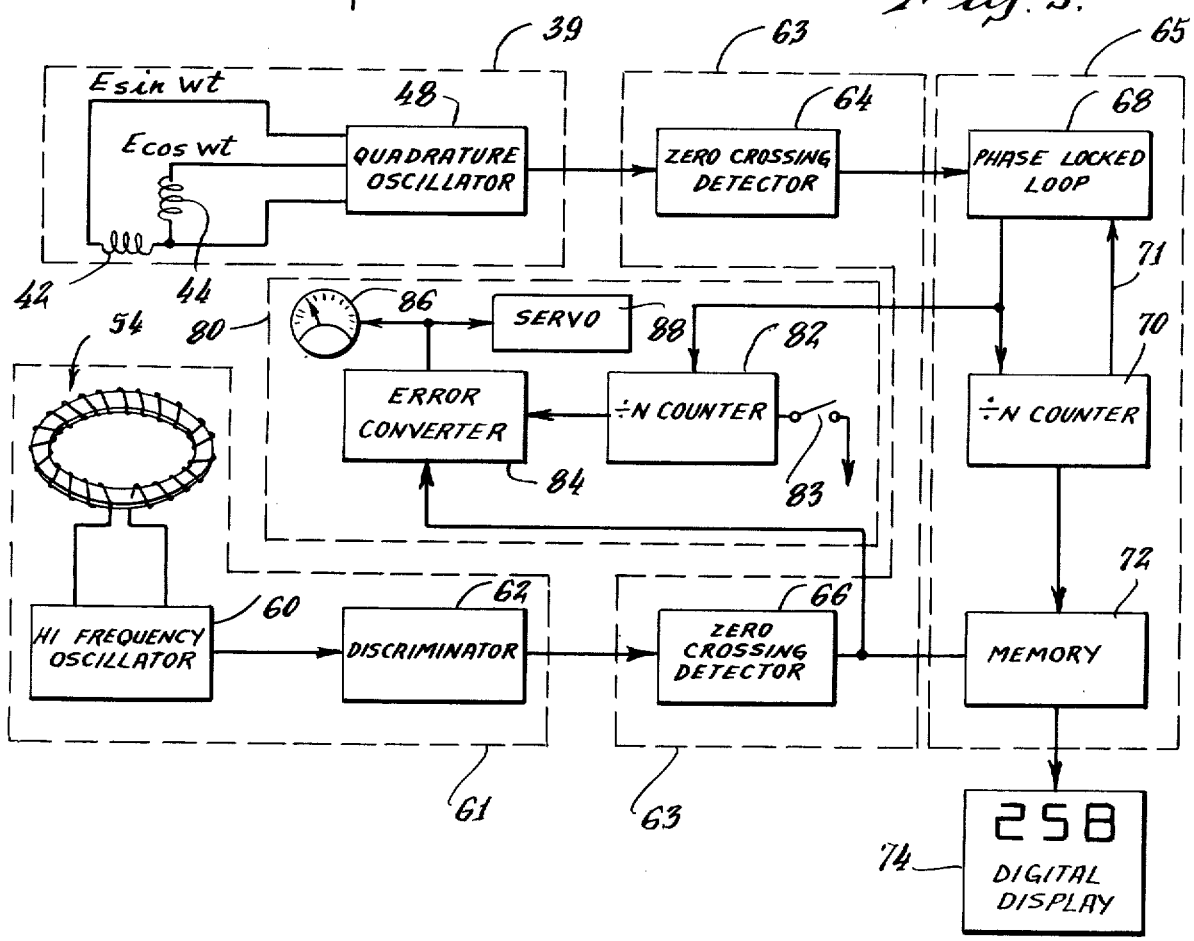
FIG. 5 is a diagrammatic view of the apparatus of the present invention.

FIGS. 4 and 5 illustrate in greater detail the preferred embodiment of the present invention. Means other than the physically rotating bar magnet are provided to establish a rotating magnetic field directly within the external field. This means 39 includes a north-south coil 40 having windings 43 wound about a card 42. An east-west coil 44 has windings 45 which are wound about the card 42 in mutually perpendicular relation to the north-south coil windings 43. One of the coils, for example, the east-west coil, is also arranged to be perpendicular to or arranged to make a known angle with the measured direction 12 to establish a known angular relationship between the rotating field and this measured direction 12 as a function of time.

A power supply, which may be a quadrature oscillator 48, provides the north-south coil with a first driving alternating electric signal which may, for example, be a driving voltage "E sin $\omega t$". The quadrature oscillator also provides the east-west coil with a second driving alternating signal, 90° out of phase with the first driving signal. For example, this signal may be a driving voltage "E cos $\omega t$". By providing the north-south and east-west coils with 90° phase shifted alternating driving signals, a rotating magnetic field having a magnetic field vector or axis in the plane of the coil support card 42 is generated. If in fact the driving signals are $E \cos \omega t$ and $E \sin \omega t$, the field rotates at a uniform angular velocity $\omega$.

Since the east-west coil 44 is perpendicular to the measured direction 12, when the driving signal provided to it has maximum amplitude, the rotating magnetic field is axially aligned with the measured direction 12 because the component of the magnetic field produced by the north-south coil is zero. Axial alignment of the measured direction and the rotating magnetic field may be detected by monitoring the driving voltage applied to the east-west coil. Moreover, the alternating driving signal to the east-west coil $E \cos \omega t$ constitutes an output signal from the quadrature oscillator that indicates the relative angular position of the rotating magnetic field and the measured direction as a function of time.

In this preferred embodiment, the means 39 for producing a rotating magnetic field are mounted within the earth's magnetic field without use of a secondary means such as a compass bar to indicate this external field. For purposes of illustration, the earth's field is shown in FIG. 4 by the position of a pointer 51 on the scale 52 of a compass card 50.

A magnetic field sensor, generally indicated at 54, is positioned to be influenced by the magnetic field between the rotating and external fields. It is shown in FIG. 4 mounted spaced from the perpendicular coils 40 and 44 with its axis coincident with the pivot axis 18. However, the sensor 54 may be mounted about the card 42 still with its axis coincident with the pivot axis 18. This magnetic field sensor includes a ring-shaped core 56 which is made of high-$\mu$ magnetic material about which a toroidal sensor coil 58 is continuously wound. The magnetic field sensor is responsive to the magnitude of total magnetic flux passing through it since the permeability of the high-$\mu$ magnetic material core is a function of the total magnetic field to which it is exposed.

The sensor coil 58 is connected to a variable high frequency oscillator (a VFO) 60 which generates an output electric signal at a frequency substantially above the frequency of rotation of the rotating magnetic field. The total magnetic field detected by the magnetic field sensor varies the permeability of the detector core which modulates the high frequency oscillator output signal. As a result, the VFO output signal has a maximum frequency when the rotating and external fields are oppositely directed and axially aligned and the total magnetic field sensed by the magnetic field sensor 54 is maximum. Conversely, the frequency of the VFO output signal is minimum when the fields are identically directed and axially aligned and the total magnetic field sensed by the magnetic sensor 54 is a minimum. Accordingly, the output signal of the high frequency oscillator 60 is frequency modulated with a frequency deviation proportional to the sensed magnetic field difference between the rotating and external magnetic field with a phase component $\phi$. The frequency modulation of the high frequency oscillator 60 may, for example, be "$E_1 \cos(\omega t + \phi)$", where $\phi$ is the angular displacement of the external magnetic field with respect to the measured direction.

The high frequency oscillator 60 is employed to provide an output signal, modulated by the permeability of the sensor 54 that is more easily operated on and less subject to distortion than other sensor types.

The modulated output signal of the high frequency oscillator 60 is demodulated by a discriminator 62 to directly obtained the modulating signal $E_1 \cos(\omega t + \phi)$. The magnetic field sensor 54, the high frequency oscillator 60, and the descriminator 62 therefore, form a means 61 for detecting oppositely directed, axial alignment of the rotating and external fields. The output signals of the quadrature oscillator 48, namely $E \cos \omega t$, and the discriminator 62, namely $E_1 \cos(\omega t + \phi)$ may be compared in the fashion described with reference to FIGS. 1, 2, and 3 to ascertain the angle $\phi$.

Means 63 are provided to compare the phase difference of the respective output signals to determine the time $t$ between the occurrences of interest. This means comprises a first zero crossing detector 64 coupled with the quadrature oscillator for producing an output signal that indicates when the quadrature oscillator output signal is zero in a positive going direction. The first zero crossing detector 64 output signal is a square wave having the same frequency and phase as the quadrature oscillator output signal $E \cos \omega t$. A second zero crossing detector 66 is coupled with the discriminator to produce an output signal that indicates when the discriminator output signal is zero in a positive going direction. The output signal of this detector 66 is a having wave hahving the same frequency and phase as the discriminator output signal $E_1 \cos(\omega t + \phi)$. Accordingly, the difference in phase between respective zero crossing detector output signals indicates the time $t$ between respective occurrences. Thus, the time difference between the positive going leading edges of the first and second zero crossing detector output signals is a measure of the angle $\phi$.

Note that the time between respective occurrence of oppositely directed, axial alignment of the external field and the measured direction relative to the rotating field is the quantity of interest. However, the zero crossing detectors actually measure this time between respective occurrences of perpendicular alignment of the external field and the measured direction relative to the rotating field. Further, as mentioned above, the time between respective occurrences of any other predetermined angular relationship of the external field and measured direction relative to the rotating field may be detected to determine $t$.

The information relating to the angle $\phi$ known in terms of time may be converted to digital or analog form by means 65 for computing the ratio of the time $t$ to the period $T$ of rotation of the rotating magnetic field multiplied by the desired scale factor $(n)$. Suitable means for accomplishing this function include a phase locked loop 68 which is operated at $(n)$ times the frequency of the output signal of the first zero crossing detector 64. Accordingly, the phase locked loop functions to divide each cycle or each period of the output signal of the first zero crossing detector into $(n)$ equal parts. Such phase locked loop circuits are well known. A circuit suitable for use in the apparatus of the present invention is manufactured by Radio Corporation of America and has part number RCA-CD-4046AE.

As noted, $(n)$ may be equal to 360. The number $(n)$ may be increased to increase the desired resolution of the apparatus of the present invention. Alternatively, a scale having units other than degrees may be used. For example, if the operator wishes to measure angles in mils, $(n)$ would be set equal to 6400.

The phase locked loop 68 is coupled to a counter 70 arranged to sequentially count each of the $(n)$ parts into which each cycle of the first zero crossing detector output is divided. The phase locked loop is operated with the positive going leading edge of the output signal of the first zero crossing detector phase locked to the reset function of the counter, indicated by feedback arrow 71, so that the counter begins a new counting cycle each time a new cycle of the first zero crossing detector output signal begins.

The continuously cycling count output of the counter 70 is fed to a memory 72. The memory is also coupled to the second zero crossing detector 66 and operates to remember the count when output signal of this detector 66 crosses zero in a positive going direction. Accordingly, the count which the memory remembers represents the angle of the external field relative to the measured direction in ($n$) increments per revolution. The effect, then, of the phase locked loop, the counter, and the memory, indicated at 65, which operate on the output signal of the first and second zero crossing detectors, is to compute the ratio of the time between respective occurrences of interest to the period of rotation of the rotating magnetic field and further to multiply this ratio by the scale factor ($n$).

A digital display 74 may be connected to the memory to provide a visual readout of the angle $\phi$ between the external magnetic field and the measured direction.

Further, the apparatus of the present invention may be provided with means 80 for calculating deviation of the measured direction from a preselected heading. This means 80 includes a second counter 32, operated in synchronism with the first counter 70, set by a switch 83 such that its count begins at the preselected heading after the counting cycle of the first counter 70 begins. An error converter 84 detects the phase relationship of the reset pulse of the second counter 82 and positive going leading edge of the output signal of the second zero crossing detector 66. The error converter then has an integrated DC output signal which feeds to a display meter 86 or an auto control servomechanism 88.

The switch 83 may be synchronized with the output of the second zero crossing detector 66 so that at the instant when activated, the reset output of the second counter 82 is in phase with the output of the second zero crossing detector 66. The reading on the meter represents the angle the measured direction has changed from its direction when the switch 83 was activated. Alternatively, the output of the error converter 84 may be used to control the servomechanism to maintain the measured direction in the fixed preset direction.

The method of the present invention includes the steps of establishing a rotating magnetic field within the external magnetic field; detecting occurrence of oppositely directed, axial alignment of the rotating and external magnetic fields; detecting occurrence of oppositely directed, axial alignment of the rotating magnetic field and the measured direction; measuring the time between the occurrences and comparing the time between occurrences with the period of rotation of the rotating magnetic field to establish a ratio of the time to the period to indicate thee measured direction relative to the external field. This method may also include the step of digitally indicating the measured direction relative to the external field by displaying the ratio multiplied by ($n$). The method may also include the step of providing an error signal indicative of deviation by the measured direction from a preset direction.

The method and apparatus of the present invention provide several advantages. The apparatus is capable of very high resolving power. The apparatus may be located directly within the external magnetic field without a secondary means such as a revolving compass bar to indicate the external field's direction. Further, this apparatus has no moving parts and though gimballing is necessary, it is less susceptible to error due to vibration and deviation from a level attitude than a stand mechanical compass.

The apparatus of the present invention is simple, and easily constructed from conventional materials and known electronic circuits. It is, therefore, inexpensive to manufacture.

It is also to be understood that various means other than those described for performing the various steps performed by the apparatus and method of the present invention may be employed. For example, means other than those described may be employed to produce the rotating magnetic field.

Although a specific embodiment of the method and apparatus of the present invention have been disclosed in detail above, it is to be understood that this is for purposes of illustration. This disclosure should not be construed as limiting the scope of the invention, since changes may be made in the described structure by those skilled in the art to adapt this method and apparatus to particular applications without departing from the scope of the following claims.

What is claimed is:

1. An apparatus for determining the orientation of an external magnetic field relative to a reference direction comprising:
    means for producing a rotating magnetic field, the magnetic field vector of which bears a known angular relationship as a function of time to the reference direction; the rotating magnetic field being located to interact with the external magnetic field;
    detector means, located in a stationary position relative to the rotating magnetic field to be influenced by the interacting rotating and external magnetic fields, for detecting the occurrence of a predetermined angular relationship between the rotating and external magnetic field vectors;
    means for measuring the time between occurrence of the predetermined angular relationship between the rotating and external field vectors and occurrence of a preselected angular relationship between the rotating field vector and the reference direction, and
    means for comparing the time between said occurrences with the period of said rotating magnetic field to determine the orientation of the external magnetic field relative to the reference direction.

2. An apparatus for determining the relationship of a reference direction relative to the direction of an external magnetic field comprising:
    means for producing a rotating magnetic field, the magnetic field vector of which bears a known angular relationship to the reference direction as a function of time, and for generating a rotating field signal indicative of the angular relationship as a function of time, the rotating magnetic field being located to interact with the external magnetic field;
    detector means located in a stationary position relative to the rotating magnetic field for sensing the interaction of the rotating magnetic field with the external magnetic field and for generating a sensor signal indicative of said interaction; and
    means responsive to the sensor signal and the rotating field signal for measuring the phase difference between said signals to determine the relationship of the reference direction relative to the direction of the external magnetic field.

3. An apparatus for determining the relationship of a reference direction relative to an external magnetic field comprising:
   means for producing a rotating magnetic field, the magnetic field vector of which bears a known angular relationship as a function of time to the reference direction; the rotating magnetic field being located to interact with the external magnetic field;
   detector means located in a stationary position relative to the rotating magnetic field for detecting the occurrence of axial alignment of the rotating and external magnetic field vectors;
   means for measuring the time between occurrence of axial alignment of the rotating and external magnetic field vectors and occurrence of axial alignment of the rotating magnetic field vector and the reference direction; and
   means for comparing the time between said occurrences with the period of rotation of said rotating magnetic field to determine the relationship of the reference direction relative to the external magnetic field.

4. An apparatus for determining the relationship of a reference direction relative to an external magnetic field comprising:
   indicator means for indicating the reference direction;
   means for producing a rotating magnetic field, the magnetic field vector of which bears a known angular relationship as a function of time to the reference direction; the rotating magnetic field being located to interact with the external magnetic field;
   detector means, located in a stationary position relative to the rotating magnetic field to be influenced by the interacting rotating and external magnetic fields, for detecting the occurrence of a predetermined angular relationship between the rotating and external magnetic field vectors;
   means for measuring the time between occurrence of the predetermined angular relationship between the rotating and external field vectors and occurrence of the predetermined angular relationship between the rotating field vector and said indicator means; and
   means for comparing the time between said occurrences with the period of rotation of said rotating magnetic field to determine the relationship of the reference direction relative to the external magnetic field.

5. The apparatus for determining the relationship of a reference direction relative to an external magnetic field as claimed in claim 4 wherein said means for producing a rotating magnetic field comprises:
   a north-south coil having at least one winding;
   an east-west coil also having at least one winding disposed in mutually perpendicular relation to said north-south coil winding;
   means for providing said north-south coil with a first driving alternating electric signal and for providing said east-west coil with a second driving alternating electric signal ninety degrees out of phase with respect to said first driving signal.

6. The apparatus for determining the relationship of a reference direction relative to an external magnetic field as claimed in claim 5 wherein said means for providing said first and second driving signals is a quadrature oscillator.

7. The apparatus for determining the relationship of a reference direction relative to an external magnetic field as claimed in Claim 6 wherein the windings of one of said north-south and east-west coils are arranged to be perpendicular to the reference direction to provide said indicator means and wherein the predetermined angular relationship between the rotating magnetic field and the reference direction is axial alignment and is indicated when the amplitude of the driving signal provided to said one coil is maximum.

8. The apparatus for determining the relationship of a reference direction relative to an external magnetic field as claimed in claim 4 wherein said detector means comprises:
   an oscillator for generating an alternating electric output signal at high frequency relative to the frequency of rotation of said rotating magnetic field; and
   a magnetic field sensor including a ring-shaped core and a coil wound about said core, mounted between the external magnetic field and said means for producing a rotating magnetic field, coupled to said high frequency oscillator to modulate the high frequency oscillator output signal in response to the magnitude of total magnetic flux through said magnetic field sensor.

9. An apparatus for determining the relationship of a reference direction relative to an external magnetic field and for indicating the reference direction relative to the external magnetic field in angular units, there being ($n$) units in the circumference of a circle, said apparatus comprising:
   indicator means for indicating the reference direction;
   means for producing a rotating magnetic field, the magnetic field vector of which bears a known angular relationship as a function of time to the reference direction; the rotating magnetic field being located to interact with the external magnetic field;
   detector means, positioned in a stationary location relative to the rotating magnetic field to be influenced by the total magnetic field of the rotating and external fields, for detecting the occurrence of a predetermined angular relationship between the rotating and external magnetic field vectors;
   means for measuring the time between occurrence of the predetermined angular relationship between the rotating and external field vectors and occurrence of the same predetermined angular relationship between the rotating field vector and said indicator means; and
   means for computing the ratio of the time between said occurrences to the period of rotation of said rotating magnetic field multiplied by ($n$) to yield the relationship of the reference direction relative to the external magnetic field.

10. The apparatus for determining and indicating the relationship of a reference direction relative to an external magnetic field as claimed in claim 9 wherein said means for producing a rotating magnetic field comprises:
   a north-south coil having at least one winding;
   an east-west coil also having at least one winding disposed in mutually perpendicular relation to said north-south coil winding; and a quadrature oscillator for providing said north-south coil with a first driving alternating electric signal and for providing said east-west coil with a second driving alternating electric signal 90° out of phase with respect to said first driving signal.

11. The apparatus for determining and indicating the relationship of a reference direction relative to an external magnetic field as claimed in claim 10 wherein said detector means comprises:
- an oscillator for generating an alternating electric output signal at high frequency relative to the frequency of rotation of said rotating magnetic field; and
- a magnetic field sensor including a ring-shaped core and a coil wound about said core, mounted to be influenced by the external and rotating magnetic fields and coupled to said high frequency oscillator to modulate the high frequency oscillator output signal in response to the magnitude of total magnetic flux through said magnetic field sensor.

12. The apparatus for determining and indicating the relationship of a reference direction relative to an external magnetic field as claimed in claim 11 wherein said detector means further comprises:
- a discriminator coupled to the high frequency oscillator to demodulate the high frequency oscillator output signal and thereby provide a discriminator output signal indicative of the relative angular position of said rotating and external magnetic fields.

13. The apparatus for determining and indicating the relationship of a reference direction relative to an external magnetic field as claimed in claim 12 wherein the windings of one of said north-south and east-west coils are arranged to be perpendicular to the reference direction to provide said indicator means; and wherein the driving signal provided to said one coil constitutes a quadrature oscillator output signal indicative of the relative position of the rotating magnetic field and said indicator means.

14. The apparatus for determining and indicating the relationship of a reference direction relative to an external magnetic field as claimed in claim 13 wherein said means for measuring the time between said occurrences comprises:
- a first zero crossing detector, coupled between said quadrature oscillator and said means for computing said ratio multiplied by ($n$), for producing an output signal that indicates when said quadrature oscillator output signal is zero; and
- a second zero crossing detector, coupled between said discriminator and said means for computing said ratio multiplied by ($n$), for producing an output signal that indicates when said discriminator output signal is zero.

15. The apparatus for determining and indicating the relationship of a reference direction relative to an external magnetic field as claimed in claim 14 wherein said means for computing the ratio of the time between said occurrences to the period of rotation of said rotating magnetic field multiplied by ($n$) comprises:
- means for dividing the period of the output signal of said first zero crossing detector into ($n$) equal parts;
- means for cyclically counting each of said ($n$) parts of said first zero crossing detector output signal, each counting cycle beginning when said quadrature oscillator output signal is zero; and
- means for determining the count in each counting cycle when the output signal of said second zero crossing detector is zero to compute said ratio multiplied by ($n$).

16. The apparatus for determining and indicating the relationship of a reference direction relative to an external magnetic field as claimed in claim 15 wherein said means for dividing the period of the output signal of said first zero crossing detector into ($n$) equal parts is a phase locked loop.

17. The apparatus for determining and indicating the relationship of a reference direction relative to an external magnetic field as claimed in claim 16 further comprising:
- means for digitally displaying said ratio multiplied by ($n$) to indicate the measured direction relative to the external magnetic field.

18. A method for determining the relationship of a reference direction relative to an external magnetic field comprising the steps of:
- establishing a rotating magnetic field located to interact with the external magnetic field and having a magnetic field vector which bears a known angular relationship as a function of time to the reference direction;
- detecting the occurrence of a predetermined angular relationship between the rotating and external magnetic field vectors;
- measuring the time between occurrence of the predetermined angular relationship between the rotating and external field vectors and occurrence of the same predetermined angular relationship between the rotating field vector and the measured direction; and
- comparing the time between said occurrences with the period of rotation of said rotating magnetic field to establish a ratio of said time to said period to indicate the relationship of the reference direction relative to the external magnetic field.

19. The method for detecting the relationship of a reference direction relative to an external magnetic field as claimed in claim 18 further comprising the step of:
- digitally indicating the relationship of the reference direction relative to the external magnetic field in angular units where there are ($n$) units in the circumference of a circle, by displaying said ratio multiplied by ($n$).

* * * * *